(12) United States Patent
Dubey et al.

(10) Patent No.: US 8,456,197 B2
(45) Date of Patent: Jun. 4, 2013

(54) DIFFERENTIAL DATA SENSING

(75) Inventors: Prashant Dubey, Greater Noida (IN);
Navneet Gupta, Ghaziabad (IN);
Shailesh Kumar Pathak, Greater Noida (IN); Kaushik Saha, Delhi (IN);
Gagandeep Singh Sachdev, Salt Lake City, UT (US)

(73) Assignee: STMicroelectronics International N.V., Amsterdam (NL)

( * ) Notice: Subject to any disclaimer, the term of this patent is extended or adjusted under 35 U.S.C. 154(b) by 156 days.

(21) Appl. No.: 13/118,858

(22) Filed: May 31, 2011

(65) Prior Publication Data

US 2012/0169378 A1 Jul. 5, 2012

(30) Foreign Application Priority Data

Dec. 29, 2010 (IN) .......................... 3149/DEL/2010

(51) Int. Cl.
*G01R 19/00* (2006.01)
*G11C 7/00* (2006.01)
*H03F 3/45* (2006.01)

(52) U.S. Cl.
USPC ............ 327/52; 327/51; 324/123 R; 330/252; 330/253; 365/207

(58) Field of Classification Search
USPC .............. 327/51, 52, 54, 55; 324/123 R, 124, 324/123 C; 330/252, 253, 255, 261–264, 330/267–269, 273, 274, 277; 365/207, 208
See application file for complete search history.

(56) References Cited

U.S. PATENT DOCUMENTS

| | | | | |
|---|---|---|---|---|
| 5,668,766 | A | * | 9/1997 | Bramnik ........................ 365/207 |
| 7,518,411 | B2 | * | 4/2009 | Kim et al. ........................ 327/52 |
| 2011/0063934 | A1 | * | 3/2011 | Sharma et al. ................. 365/207 |

* cited by examiner

*Primary Examiner* — Patrick O'Neill
(74) *Attorney, Agent, or Firm* — Gardere Wynne Sewell LLP

(57) ABSTRACT

A first sensing circuit has input terminals coupled to a true differential signal line and a complementary differential signal line. A second sensing circuit also has input terminals coupled to said true signal and said complementary signal. Each sensing circuit has a true signal sensing path and a complementary signal sensing path. The first sensing circuit has an imbalance that is biased towards the complementary signal sensing path, while the second sensing circuit has an imbalance that is biased towards the true signal sensing path. Outputs from the first and second sensing circuits are processed by a logic circuit producing an output signal that is indicative of whether there a sufficient differential signal for sensing has been developed between the true differential signal line and the complementary differential signal line.

19 Claims, 2 Drawing Sheets

US 8,456,197 B2

DIFFERENTIAL DATA SENSING

PRIORITY CLAIM

This application claims priority from Indian Patent Application 3149/DEL/2010 filed Dec. 29, 2010, the disclosure of which is hereby incorporated by reference.

TECHNICAL FIELD

This invention relates to differential data sensing, for example using a differential value of voltage, charge or current.

BACKGROUND

There are a number of different types of sensors suitable for use in differential data sensing. FIG. 1 is an example of a latch-based sensor used for sensing differential data. Input PMOS transistors 2,4 are connected respectively between a true signal (BL) and complementary signal (BLB) and a latch circuit 6. The gates of the input transistors 2, 4 each receive a sensor enable signal En which, when applied with logic value 0, allows nodes 8 (INP) and 10 (INN) of the latch circuit 6 to follow the values of the input true signal and complementary signal. An NMOS transistor 12 is connected between a common node 3 of the latch 6 and ground. The gate of the transistor 12 is also connected to receive the enable signal En such that with a logic value 0, transistor 12 is turned off. When enable signal En is logic value 1, transistor 12 will be on and transistors 2, 4 are turned off thereby allowing the latch circuit 6 to operate to pull up one of the outputs 8, 10 and pull down the other output, depending on which input signal is falling with respect to the other one.

The latch circuit 6 comprises PMOS transistor T1 and NMOS transistor T3 connected in series between a supply voltage Vdd and the common node 3. The latch circuit further comprises a pair of transistors including PMOS transistor T2 and NMOS transistor T4 connected in series between the supply voltage Vdd and the common node 3. The gates of the transistors T1 and T3 are connected in common and to junction node INN of the transistors T2 and T4. Similarly, the gates of the transistors T2 and T4 are connected in common and to junction node INP of the transistors T1 and T3. In operation, if we use the sensor circuit 6 for memory read from a memory cell as a sense amplifier, a precharge cycle precharges the bit lines (BL and BLB) to a precharge voltage. The control signal En is kept at a logic low causing the PMOS transistors 2, 4 to conduct and thereby passing on the swing generated by the memory cell to the latch. The sensor control signal En is then transitioned to logic high, causing the ground GND to be connected to the latch circuit 6 via transistor 12. One of the voltages transferred from the input signals (on lines BL and BLB) having a higher value would cause one of the NMOS transistors T3 or T4 to conduct more than the other. The transistor that conducts less will have a higher voltage at the drain terminal in comparison to the other NMOS transistor in the latch circuit 6. As a result, one of transistor T1 or T2 will conduct. Decreasing the rate of fall of the slower transistor further eventually brings it into a linear region of operation. The PMOS itself will move into a cut off region of operation. Then, the junction nodes INP and INN will be placed at two extremes of the supply voltage, i.e., one is pulled up to the supply voltage Vdd and the other is pulled down to the ground GND, depending on the value of the data signals received from the memory cells. This value is fed to an inverter (14 or 16) which works as an output driver for the signal and provides the output. Thus, the cross coupled latch sensor amplifies the true and the complementary data signals by a difference (Vdd-GND), where Vdd is a supply voltage and GND is a ground voltage.

A latch-based sensor circuit has a fast reaction time, e.g. 200 ps, and can be designed against global and local mismatch. The successful operation of the amplifier of FIG. 1 rests on the fact that it is not biased towards the true or complementary signal. In practice, a physical mismatch between the two complementary sides of the differential sensor is inevitable, and can cause the sensor to latch the wrong data due to the offset if an insufficient differential voltage is developed between the input signals. The inputs and outputs need to be carefully isolated: automated placement and routing can lead to unwanted coupling effects.

SUMMARY

Differential data can be susceptible to noise or on chip variation in case the differential value (voltage, current or a charge) is a very small quantity. Embodiments enable generation of a flag signal indicating a "NOT OK" condition, which indicates the quality of the differential data, that is whether it is worth sensing or not. Based upon this signal generation, one can take a corrective action, by making the differential signal better in terms of its own noise properties (increasing the differential signal). The signal generated with this system will then indicate an "OK" flag after the suitable adjustments of the above mentioned quantity, setting a minimum level on the input differential data which can be reliably sensed.

According to one aspect, there is provided a sensor circuit for sensing differential data having a true signal and a complementary signal, comprising: a first sensing circuit having input terminals for coupling to the true signal and the complementary signal, the first sensing circuit having a true signal sensing path and a complementary signal sensing path, with an imbalance biased towards the complementary signal, and a first output terminal; a second sensing circuit having input terminals for coupling to the true signal and the complementary signal, the second sensing circuit having a true signal sensing path and a complementary signal sensing path, with an imbalance biased towards the true signal, and a second output terminal; and logic circuitry coupled to the output terminals to provide an indication as to whether there is sufficient differential signal for sensing between the true signal and the complementary signal.

In one embodiment, the first sensing circuit is arranged in a first part of the sensor, and the second sensing circuit is arranged in a second part of the sensor, and the logic circuitry comprises a logic gate coupled to the first and second output terminals.

In another embodiment, the sensor comprises an N number of the first sensing circuits and the N number of the second sensing circuits having input terminals for coupling between the true signal and complementary signal, the sensor circuit being a neutral system of sensing circuits. In this case, each sensing circuit provides an output indicative of the differential data applied on the sensor inputs resulting from a sensing operation carried out by that sensing circuit and the logic circuitry receives outputs from the first sensing circuits and from the second sensing circuits, wherein logic circuitry provides a resolved output. The resolved output may provide said indication as to whether there is sufficient differential signal for sensing between the true signal and the complementary signal. In these other embodiments, the drain node of each sensing circuit may be coupled to the second supply voltage (e.g. ground) via a common enable transistor. There may also be a logic circuit connected to receive the resolved output and to provide the indication indicating whether or not an adequate differential signal has been developed.

In some embodiments, the sensor circuit is for use in memory read to thereby produce a resolved output, wherein the logic circuitry is configured to provide an indication as to whether there is sufficient differential signal for sensing between the signals on a true bit line and a complementary bit line from a memory.

In yet another embodiment the sensor circuit comprises an N number of the first sensing circuits wherein at least some of the N first sensing circuits have different imbalances, and the N number of the second sensing circuits wherein at least some of the N second sensing circuits have different imbalances, having input terminals for coupling between the true signal and complementary signal, the sensor circuit being a neutral system of sensing circuits; each sensing circuit providing an output indicative of the differential data applied on the sensor inputs resulting from a sensing operation carried out by that sensing circuit; wherein the logic circuitry is configured to receive outputs from the first sensing circuits and outputs from the second sensing circuits to provide a resolved output. In some embodiments all N first sensing circuits have different imbalances, and all N second sensing circuits have different imbalances.

In the following described embodiments, an imbalance is created by relative sizing of transistors. That is, in the described embodiment, the sensing paths are operatively coupled for sensing between first and second supply voltages. The first and second supply voltages may be for example a positive supply voltage Vdd and a ground voltage. Each sensing path comprises a pull-up transistor coupled between the first supply voltage and a junction node, and a pull-down transistor coupled between the junction node and a drain node connectable to the second supply voltage. The pull-down transistor in the complementary signal voltage sensing path of the first sensing circuit is larger than the pull-down transistor in the true signal voltage sensing path of the first sensing circuit. The opposite is applied in the second sensing circuit, that is the pull-down transistor in the true signal sensing path of a second sensing circuit is larger than the pull-down transistor in the complementary signal sensing path of the second sensing circuit.

However, the imbalance could be created in different ways, for example, by increasing capacitance at the nodes or respective sizing of inverters on the output paths. Moreover, although latch circuits are described in the following described embodiments for each part of the sensor, other types of sensor circuit can be utilised adopting a similar principle of imbalance in multiple parts of a sensor circuit.

Embodiments are based on the novel principle of providing an indication when data output from a sensor is invalid and therefore cannot be relied upon. Such a signal can be used in a number of applications in the design and run time applications of circuits.

BRIEF DESCRIPTION OF THE DRAWINGS

For a better understanding of the embodiments and to show how the same may be carried into effect, reference will now be made, by way of example, to the accompanying drawings wherein.

DETAILED DESCRIPTION OF THE DRAWINGS

In the described embodiment, the circuit ascertains whether or not a sufficient differential signal for accurate sensing has been attained to allow the sensor enable signal to be applied at an appropriate time. For example, in the case of a memory read circuit, in the following described embodiments, the sensor enable signal is applied at a differential voltage of around 50-80 mV. To achieve this, the circuits described herein produce a novel signal OutputNotOk, indicating that an output from the sensor circuit is invalid.

Figure 1:
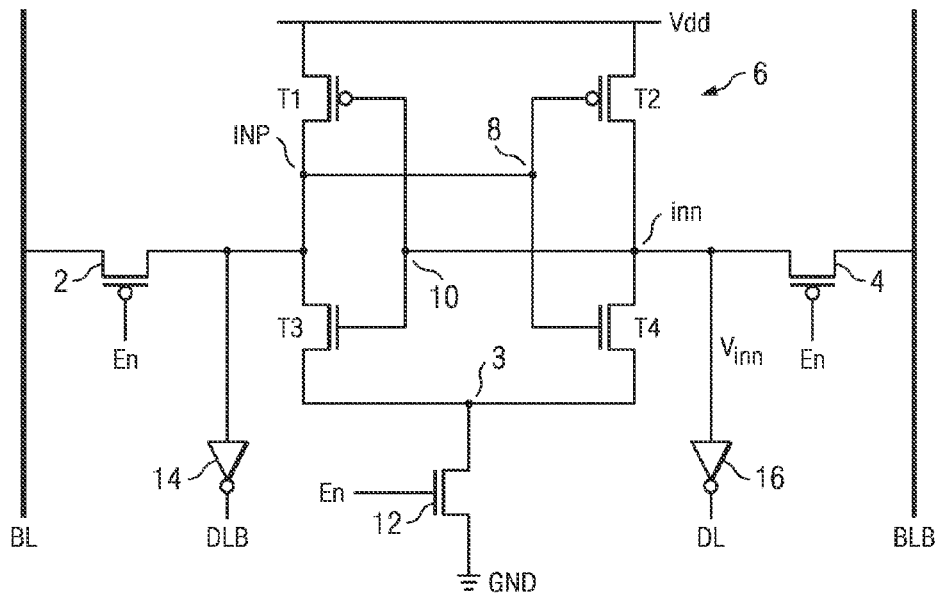
FIG. 1 is a circuit diagram of a latch-based sensor circuit.
Figure 2A:
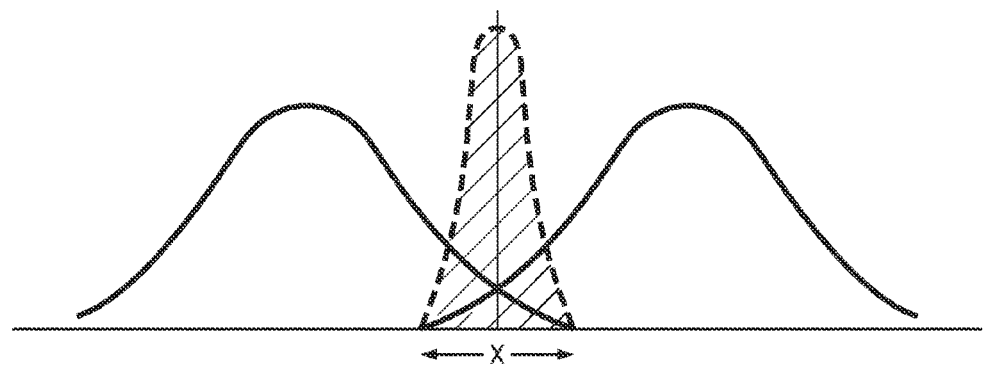
FIG. 2A is a graphical representation of threshold voltages.
Figure 2:
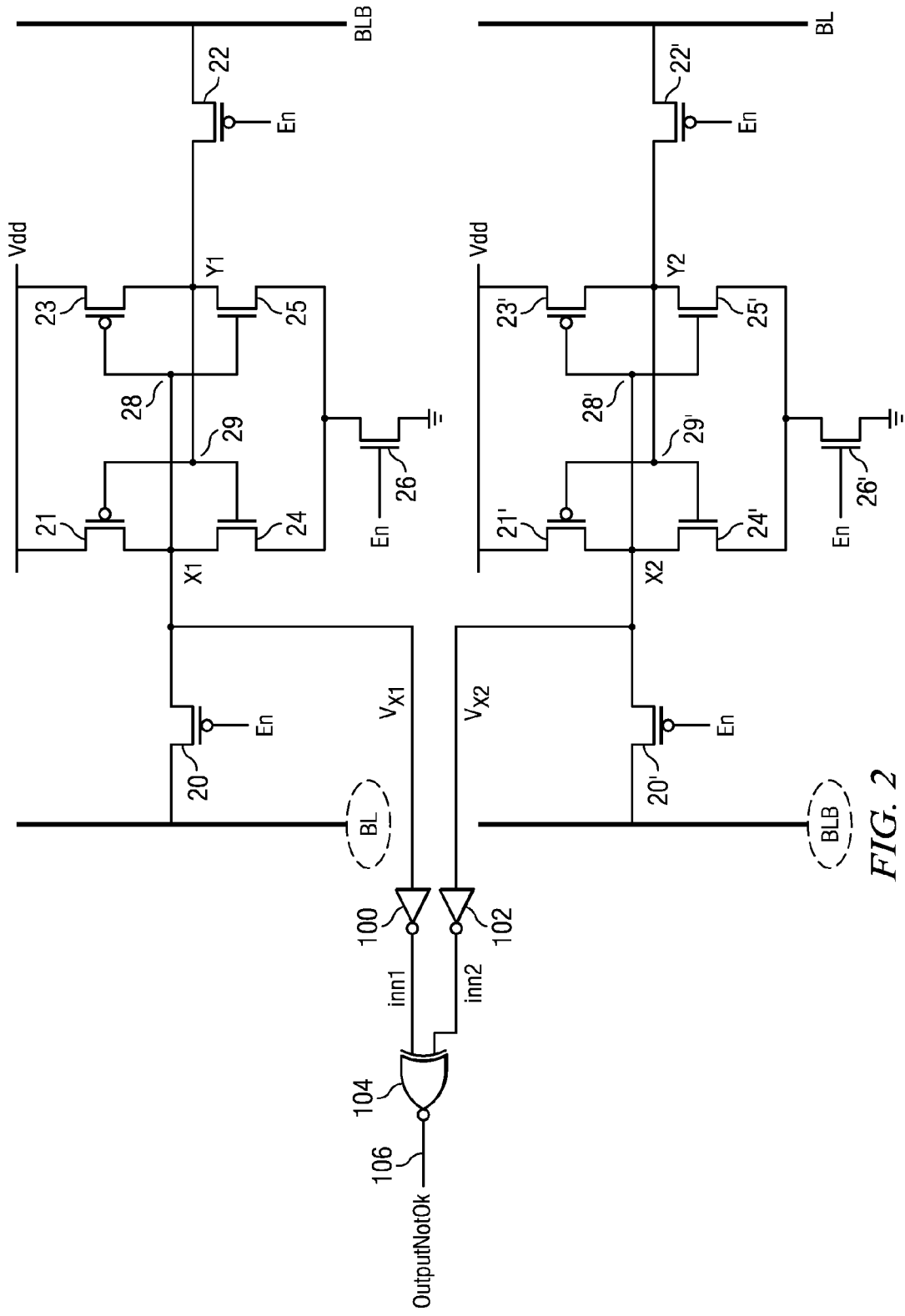
FIG. 2 is a circuit diagram of a dual imbalanced latch-type sensor circuit.

FIG. 2 is a circuit diagram of a dual imbalance latch-type sensor circuit. The circuit consists of two parts. In the first part, input transistors 20, 22 are respectively coupled to the true signal (BL) and complementary signal (BLB). The input transistors 20, 22 are PMOS transistors receiving a sensor enable signal En at their gates. When the input transistors 20, 22 are enabled, the voltage levels on the true and complementary signals BL, BLB are passed to input nodes X1, Y1 respectively. X1 and Y1 are also referred to as "junction nodes". Latch transistors 21, 23, 24, 25, are connected in a latch configuration similar to that illustrated and described with reference to the latch-based sensor circuit of FIG. 1. An NMOS pass transistor 26 receives the sensor enable signal En at its gate and is connected to a common node of the latch circuit. An amplified voltage is developed at output 28 or 29 when the enable signal is high, depending on the differential data at the input of sensor. There is a difference with respect to the latch circuit of FIG. 1, in that in the latch circuit of FIG. 1, the transistors within the latch circuit 6 are designed to be balanced. In the circuit of FIG. 2, however, the NMOS transistor 25 is sized so as to deliberately imbalance the latch, making input Y1 stronger. In other words, the first part is biased towards the complementary signal BLB, so that up to a certain threshold voltage $V_T$, the first part indicates that complementary signal is falling. For the first part to indicate that the true signal is falling, the voltage of the true signal must fall by at least $V_T$ to overcome the imbalance caused by NMOS transistor 25.

The second part of the circuit of FIG. 2 has a configuration which is similar to that of the first part, and therefore, like numerals denote like parts, but primed.

Note, however, that input transistor 20' (corresponding to input transistor 20) is connected to the complementary signal BLB, while input transistor 22' (corresponding to input transistor 22) is connected to the true signal BL. Once again, however, transistor 25' is sized to induce an imbalance in the latch, such that input Y2 is stronger than input X2. The voltage at input X1, $V_{X1}$, and the voltage at input X2, $V_{X2}$ are passed to respective inverters 100, 102. The outputs of the inverters INN1, INN2 denote the differential data value applied on the input of sensor ("0" for true signal falling, "1" for complementary signal falling) and are supplied to an exclusive NOR gate 104. The output signal OutputNotOk 106 of gate 104 indicates whether or not an adequate differential voltage Vdiff has been generated for sensing. In a described embodiment, a logical state of zero indicates that enough differential voltage has been generated, while a logical state of one indicates that inadequate differential voltage has been generated. While the preferred embodiment described here detects a differential voltage signal, other types of differential signals may be detected, such as a different current signal or a differential charge signal.

Considering the input signals INN1, INN2 to the XNOR gate 104, three states of these input signals are possible in the dual imbalanced latch-type sensor circuit of FIG. 2.

1,1—Enough differential has not been formed 1,0—Enough differential formed, and the true signal has fallen 0,1—Enough differential formed, and complementary signal has fallen In this context, "enough" differential signifies the amount determined by PVT (process, voltage, temperature) and mismatch variations inside the sensor circuit, such that it is an adequate differential signal to indicate whether a one or a zero has been latched.

The operation and advantages of the circuit will now be described with reference to FIG. 1A and FIG. 2A. Consider the sense amplifier of FIG. 1. The idea is that when the true signal falls, the amplifier will latch a high voltage (Vdd) on the output 10 indicating a logic 0, and vice-versa for a logic 1. Ideally, a logic 0 would be indicated as long as the voltage of the true signal>the voltage of the complementary signal, as shown by the dividing line Vtrue signal=Vcomplementary signal in FIG. 1A.

However, the sensor circuit only operates successfully to determine a logic value 1 to the extent that the voltage of the true signal is greater than the voltage of the complementary signal by the difference between the threshold value of transistor 2 and the threshold value of transistor 4, herein termed the "offset". Within the range of the offset, the differential voltage Vdiff cannot be determined, which is denoted by don't care state X in FIG. 1A. When Vcomplementory signal is greater than Vtrue signal (taking into account the offset) the output denotes that the differential data had a logic value of zero stored therein.

Figure 1A:
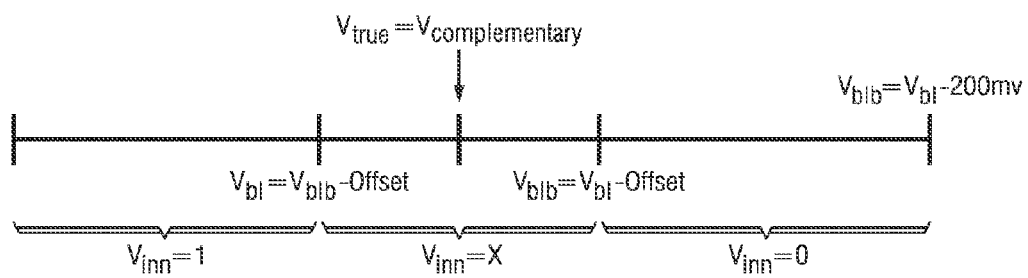
FIG. 1A is an explanatory voltage diagram of the sensor unit of FIG. 1.

With the circuit of FIG. 1, this "don't care" state is hidden from a user—the circuit will latch a "1" or a "0" without any indication that it might be in error due to an inadequate differential voltage to overcome the offset. In embodiments of the present invention, an imbalance is deliberately designed into each part of the sensing circuit, such that one part has a tendency to indicate that one signal has fallen until the other signal falls by more than a threshold voltage $V_T$. For example, assume a 50 mV threshold voltage, and the true signal is falling (logic 0). The first part will indicate that the complementary signal is falling until the true signal reaches 51 mV (assuming no offset), when it will latch to indicate that the true signal is falling. Thus, the OutputNotOk output will change state from "1" to "0" at 51 mV.

The dual imbalanced latch circuit has the advantage that it cannot "tip" for small unintended differentials between the true signal and the complementary signal thus indicating incorrect data. There must be at least a minimum threshold of differential signal attained between the true signal and the complementary signal until the latch operates to indicate data. Although it is desirable to have a common threshold signal amongst a plurality of sensor circuits in any particular system, in fact, due to process variations, there will be differences. Furthermore, even if the offset between transistors can be made very small, that will also exist and will have an effect. The consequence of this is shown in FIG. 2A which illustrates the distribution of threshold voltages across a plurality of sense amplifiers. On the right-hand side of the Y axis, a Gaussian distribution is illustrated for threshold voltages of the first part, biased towards the complementary signal. On the left-hand side of the Y axis is shown a Gaussian distribution, which is somewhat similar, for the threshold voltages of the second part, biased towards the true signal. A central Gaussian distribution, which is shaded, shows the resolved output. In this situation, there will be a region where the individual Gaussian curves overlap which represents a "don't care" region of operation, marked "X". In this region, there is an inadequate differential signal for correct sensing and this state is indicated by the OutputNotOk output of the logic gate 104.

There has therefore been described a sensor circuit for setting an "OutputNotOK" signal to indicate whether the output of the different sensor can be relied upon.

In the sensor circuit shown in FIG. 2 consists of a first part and a second part. However, sensor circuits of other embodiments may include a number N first parts and N second parts and logic circuitry may be used to receive the outputs from each part and to provide a resolved output to provide an "OutputNotOk" signal. By setting N to be more than one, the reliability in the validity of the "OutputNotOk" signal can be improved. The different parts may be imbalanced differently such that they have different minimum thresholds of differential signal which must be attained between the true signal and the complementary signal before the latch operates to indicate data.

While this invention has been particularly shown and described with reference to preferred embodiments, it will be understood by those skilled in the art that various changes in form and detail may be made without departing from the scope of the invention as defined by the appendant claims.

What is claimed is:

1. A sensor circuit, comprising:
   a first sensing circuit having input terminals coupled to a true differential signal line and a complementary differential signal line, the first sensing circuit having a true signal sensing path and a complementary signal sensing path, with an imbalance that is biased towards the complementary signal sensing path, and having a first output terminal;
   a second sensing circuit having input terminals coupled to said true differential signal line and said complementary differential signal line, the second sensing circuit having a true signal sensing path and a complementary signal sensing path, with an imbalance that is biased towards the true signal sensing path, and having a second output terminal; and
   logic circuitry coupled to the first and second output terminals and adapted to provide an indication as to whether there is sufficient differential signal for sensing between the true differential signal line and the complementary differential signal line.

2. The sensor circuit according to claim 1, wherein the true and complementary differential signal lines are configured to carry one of a differential voltage signal, a differential current signal or a differential charge signal.

3. The sensor circuit according to claim 1 wherein the sensing paths are operatively coupled for sensing between a first supply voltage node and a second supply voltage node.

4. The sensor circuit according to claim 3, wherein each sensing path comprises a pull-up circuit coupled between the first supply voltage node and a junction node, and a pull-down circuit coupled between the junction node and a second supply voltage node.

5. The sensor circuit according to claim 4, wherein the pull-up circuit comprises a PMOS transistor and the pull-down circuit comprises an NMOS transistor, and wherein said imbalance is effectuated by sizing the NMOS transistor in one signal sensing path of the sensing circuit larger than the NMOS transistor in the other signal sensing path of said sensing circuit.

6. The sensor circuit according to claim 5, wherein:
in the first sensing circuit, the NMOS transistor in the complementary signal sensing path is larger than the NMOS transistor in the true signal sensing path; and
in the second sensing circuit, the NMOS transistor in the true signal sensing path is larger than the NMOS transistor in the complementary signal sensing path.

7. The sensor circuit according to claim 1, wherein the first sensing circuit comprises a cross-coupled latching circuit configured to be biased towards the complementary differential signal line; and wherein the second sensing circuit comprises a cross-coupled latching circuit configured to be biased towards the true differential signal line.

8. The sensor circuit according to claim 1, wherein the logic circuitry comprises a logic gate having a first input coupled to the first output terminal of the first sensing circuit and a second input coupled to the second output terminal of the second sensing circuit.

9. The sensor circuit according to claim 1, wherein said imbalance in each of the first and second sensing circuits is provided by sizing at least one transistor in one of the signal sensing paths differently from at least one corresponding transistor in another of the signal sensing paths.

10. The sensor circuit according to claim 1 wherein the sensor circuit is neutral and unbiased towards either the true differential signal line or the complementary differential signal line.

11. The sensor circuit according to claim 1,
wherein said first sensing circuit comprises N first sensing circuits coupled between the true differential signal line and complementary differential signal line and having N first outputs;
wherein said second sensing circuit comprises N second sensing circuits coupled between the complementary differential signal line and true differential signal line and having N second outputs;
wherein the logic circuitry is coupled to the N first and N second output terminals and adapted to provide an indication as to whether there is sufficient differential signal for sensing between the true differential signal line and the complementary differential signal line; and
wherein N is greater than 1.

12. The sensor circuit according to claim 11, wherein each of the N first sensing circuits has an imbalance that is biased towards the complementary signal sensing path and wherein each of the N second sensing circuits has an imbalance that is biased towards the true signal sensing path.

13. The sensor circuit according to claim 12, wherein said imbalances in the N first sensing circuits are different, and wherein said imbalances in the N second sensing circuits are different.

14. The sensor circuit according to claim 11, wherein at least some of the N first sensing circuits have imbalances that are biased towards the complementary signal sensing path and wherein at least some of the N second sensing circuits have imbalances that are biased towards the true signal sensing path.

15. The sensor circuit according to claim 12, wherein all of the N first sensing circuits have different imbalances, and wherein all of the N second sensing circuits have different imbalances.

16. The sensor circuit according to claim 1, wherein the true differential signal line and the complementary differential signal line are complementary bit lines adapted to be coupled to a memory circuit, and wherein said indication provided by the logic circuit is indicative of whether a sufficient differential signal for sensing is present on the complementary bit lines.

17. The sensor circuit according to claim 1, wherein said logic circuit is configured to process signals at the first and second output terminals and provide said indication which indicates whether an adequate differential signal has been developed between the true differential signal line and the complementary differential signal line.

18. A sensor circuit, comprising:
a first sense amplifier having a first cross-coupled latch circuit with first and second latch nodes, wherein said first cross-coupled latching circuit is configured with an operation biased towards the first latch node;
a second sense amplifier having a second cross-coupled latch circuit with third and fourth latch nodes, wherein said second cross-coupled latching circuit is configured with an operation biased towards the third latch node;
a differential signal pair including a first differential signal line and a second differential signal line;
wherein said first latch node is coupled to the first differential signal line;
wherein said third node is coupled to the second differential signal line; and
a logic circuit coupled to an output node of the first sense amplifier and an output node of the second sense amplifier, wherein the logic circuit is configured to generate a signal indicative of whether a sufficient differential signal for sensing has been developed between the first differential signal line and the second differential signal line.

19. A sensor circuit, comprising:
a first sense amplifier having first and second differential signal input nodes, and having a first latch node coupled to the first differential signal input node and a second latch node coupled to the second differential signal input node, and wherein said first sense amplifier is configured with an operation that is biased towards the first latch node;
a second sense amplifier having third and fourth differential signal input nodes, and having a third latch node coupled to the third differential signal input node and a fourth latch node coupled to the fourth differential signal input node, and wherein said second sense amplifier is configured with an operation biased towards the third latch node;
a differential signal pair including a first differential signal line and a second differential signal line;
wherein said first differential signal input node is coupled the first differential signal line;
wherein said third differential signal input node is coupled to the second differential signal line; and
a logic circuit coupled to the first latch node of the first sense amplifier and the third latch node of the second sense amplifier, wherein the logic circuit is configured to generate a signal indicative of whether a sufficient differential signal for sensing has been developed between the first differential signal line and the second differential signal line.

* * * * *